US005344789A

United States Patent [19]
Terashima

[11] Patent Number: 5,344,789
[45] Date of Patent: Sep. 6, 1994

[54] METHOD OF MANUFACTURING VERTICAL DMOS TRANSISTOR WITH HIGH OFF-BREAKDOWN-VOLTAGE AND LOW ON-RESISTANCE

[75] Inventor: Tomohide Terashima, Fukuoka, Japan

[73] Assignee: Mitsubishi Denki Kabushiki Kaisha, Tokyo, Japan

[21] Appl. No.: 155,801

[22] Filed: Nov. 23, 1993

Related U.S. Application Data

[62] Division of Ser. No. 863,758, Apr. 6, 1992, Pat. No. 5,293,056.

[30] Foreign Application Priority Data

Jun. 17, 1901 [JP] Japan ................................. 3-144709

[51] Int. Cl.$^5$ .................................. H01L 21/44
[52] U.S. Cl. ..................... 437/41; 437/203; 437/958; 148/DIG. 50
[58] Field of Search ............. 437/40, 41, 909, 203, 437/90, 958; 148/DIG. 50, 53; 257/330, 339

[56] References Cited

U.S. PATENT DOCUMENTS

| | | | |
|---|---|---|---|
| 4,326,332 | 4/1982 | Kenney | 29/571 |
| 4,374,455 | 2/1983 | Goodman | 29/571 |
| 4,914,050 | 4/1990 | Shibata | 437/38 |
| 4,937,202 | 6/1990 | Maas | 437/40 |
| 5,023,196 | 6/1991 | Johnson et al. | 437/40 |

FOREIGN PATENT DOCUMENTS

| | | |
|---|---|---|
| 2002958A | 2/1979 | Fed. Rep. of Germany . |
| 59-80970 | 5/1984 | Japan . |

OTHER PUBLICATIONS

Chang, T. and D. Critchlow, "Vertical Fet RAM with deep trench isolation," IBM Tech. Dis. Bulletin, IBM Corp., 1980.

*Primary Examiner*—George Fourson
*Assistant Examiner*—David M. Mason
*Attorney, Agent, or Firm*—Oblon, Spivak, McClelland, Maier & Neustadt

[57] ABSTRACT

A semiconductor device includes an N$^-$ type semiconductor layer (2). The N$^-$ type semiconductor layer (2) includes a triangular pole trench (10), an apex portion thereof contains a gate electrode (5). The trench (10) penetrates the semiconductor layer (2) and a P type well region (3) and projects into an N$^+$ type source region (4). A source electrode (7) is disposed so as to be insulated from the semiconductor layer (2) by an oxide film (9) and in contact with the well region (3) and the source region (4). A drain electrode (8) is connected to the semiconductor layer (2) through an N$^+$ type semiconductor substrate (1). With higher potential at the gate electrode (5) than at the source electrode (7), the well region (3) is partially inverted into N type near the trench (10). Thus, the semiconductor device is turned on due to a channel created associated to the conductivity type inversion. Most of current flow allowed in the semiconductor layer (2) by the channel flows near the trench (10).

Hence, even when process patterns are refined, electrode-to-electrode insulation remains undegraded in the semiconductor device, attaining low on-resistance and nigh off-breakdown voltage.

5 Claims, 14 Drawing Sheets

METHOD OF MANUFACTURING VERTICAL DMOS TRANSISTOR WITH HIGH OFF-BREAKDOWN-VOLTAGE AND LOW ON-RESISTANCE

This is a division of application Ser. No. 07/863,758, filed on Apr. 6, 1992, now U.S. Pat. No. 5,293,056.

BACKGROUND OF THE INVENTION

1. Field of the Invention

The present invention relates to a semiconductor device which has high off-breakdown-voltage and low on-resistance.

2. Description of the Background Art

FIG. 1 is a cross sectional view of a conventional double diffused MOSFET transistor (VDMOS transistor). In the VDMOS transistor, an N− type semiconductor layer 2 is formed on an N+ type semiconductor substrate 1. The N− type semiconductor layer 2 includes P type well regions 3 each including N+ type source regions 4. The P type well regions 3 and the N+ type source regions 4 are created by ion implantation; for example, boron-implantation to create the P type well regions 3 and arsenic-implantation to create the N+ type source regions 4. A gate oxide film 6, a gate electrode 5, a source electrode 7 and an oxide film 6 are formed on the N− type semiconductor layer 2. A drain electrode 8 is disposed on the bottom major surface of the semiconductor substrate 1.

Thus, the device of FIG. 1 is an N-channel VDMOS transistor. When the source electrode 7 and the gate electrode 5 are commonly at low potential and the drain electrode 8 is at high potential, the P type well region 3 immediately under the gate electrode 5 does not invert into N type. Hence, the semiconductor layer 2 comprises a depletion layer extending from a PN junction between the well region 3 and the semiconductor layer 2 toward the semiconductor substrate 1. In the conventional N-channel VDMOS transistor, the growing depletion layer reaches the semiconductor substrate 1, thereby breakdown voltage being maintained (OFF state).

When voltage applied to the gate electrode 5 is changed so that the gate electrode 5 is at higher potential than the source electrode 7, the P type well region 3 immediately under the gate electrode 5 inverts into N type. Hence, electron flow is allowed from the source region 4 to the semiconductor substrate 1 through the N-inverted portion (ON state).

It is known that on-resistance primarily depends on resistance at N-inverted portion of the well region 3, i.e., channel resistance, JFET resistance, which is created between neighboring well regions 3, and resistance of the semiconductor layer 2. Although the resistance of the semiconductor layer 2 decreases with an increase in its impurity concentration and a decrease in its thickness, too small thickness and too high impurity concentration must be avoided. Too small thickness leads to deterioration in breakdown voltage while too high impurity concentration hinders a depletion layer from growing as desired. Thus, high breakdown voltage and low resistance of the semiconductor layer 2 are just not compatible: high breakdown voltage is ensured only in return of an insufficient reduction the resistance of the semiconductor layer 2, i.e., at the expense of low on-resistance.

Decreased channel resistance and decreased JFET resistance are possible if process patterns have refined features, in other words, if diffusion profiles of the well region 3 and the source region 4 are optimal. However, this also has disadvantages. When the process patterns become refined, the gate electrode 5 and the source electrode 7 short-circuit due to degraded insulation therebetween, with a result that a yield drops. In addition, it becomes difficult to form the source electrode 7 because the source electrode 7 needs to contact both the well region 3 and the source region 4.

SUMMARY OF THE INVENTION

The present invention relates to a semiconductor device. The semiconductor device according to an aspect of the present invention comprises: a first conductivity type first semiconductor layer having an top major surface and a bottom major surface; a second conductivity type second semiconductor layer formed in the top major surface of the first semiconductor layer; at least one first conductivity type third semiconductor layer selectively formed in an top surface of the second semiconductor layer; a first trench extending from the bottom major surface of the first semiconductor layer into the third semiconductor layer through the first and the second semiconductor layers; a first insulation layer coating the first trench; a first control electrode disposed opposite the second semiconductor layer through the first insulation layer; a first electrode formed on an uncoated surface of the second and the third semiconductor layers; and a second electrode formed in bottom major surface side.

Preferably, the second semiconductor layer is selectively formed in the top major surface of the first semiconductor layer.

In another preferred aspect, the semiconductor device further comprises a second insulation layer which is selectively formed at least on the top major surface of the first semiconductor layer, the second insulation layer insulating the first electrode from the first semiconductor layer.

In still another preferred aspect, the semiconductor device comprises a first conductivity type fourth semiconductor layer, the fourth semiconductor layer being disposed between the bottom major surface of the first semiconductor layer and the second electrode.

Preferably, the first trench gains in cross sectional area with a distance from the top major surface to the bottom major surface, the cross sectional area being perpendicular to a direction along which the distance is measured.

Preferably, the first trench is a triangular pole.

Preferably, the semiconductor device includes a plurality of third semiconductor layers.

Preferably, the semiconductor device further comprises: a fifth semiconductor layer selectively formed in the top surface of the second semiconductor layer and between adjacent third semiconductor layers a second trench extending from an top surface of the fifth semiconductor layer into the first semiconductor layer through the second semiconductor layer a third insulation layer covering the second trench and a second control electrode disposed opposite the second semiconductor layer through the third insulation layer.

The present invention also relates to a method of manufacturing a semiconductor device. The method comprises the steps of: (a) etching a first conductivity type first semiconductor layer having an top major surface and a bottom major surface, the etching being initiated from the bottom major surface, thereby at least one first trench being formed; (b) forming a first insulation layer entirely on a bottom surface of a structure obtained in the step (a); (c) depositing a first conductive layer on the first insulation layer; (d) selectively removing the first conductive layer except for a portion within the first trench at an apex portion, thereby a first control electrode being obtained; (e) polishing the first semiconductor layer from the top major surface to leave a predetermined thickness of said first semiconductor layer; (f) removing the first insulation layer except at a portion covering the first trench; (g) selectively forming a second conductivity type second semiconductor layer on the major top surface so that at least one apex portion of the at least one first trench is contained by the second semiconductor layer; (h) selectively forming a first conductivity type third semiconductor layer in the top surface of the second semiconductor layer so that the at least one first trench is contained at the apex portion thereof by the third semiconductor layer; (i) forming a first electrode, the first electrode being insulated from the first semiconductor layer at the top major surface, the first electrode being in contact with the second and the third semiconductor layers; and (j) forming a second electrode in bottom major surface side.

Preferably, the step (i) further comprises the steps of: (i-1) forming a second insulation layer at least on the top major surface of the first semiconductor layer; and (i-2) forming a first electrode entirely across a top surface of a structure obtained in the steps (a) to (i-2).

Preferably, the step (j) further comprises the steps of: (j-1) forming a first conductivity type fourth semiconductor layer in the bottom major surface of the first semiconductor layer; and (j-2) forming a second electrode on the fourth semiconductor layer.

In another preferred aspect, a plurality of first trenches are formed and a plurality of apex portions are contained in the third semiconductor layer.

In still another preferred aspect, the method further comprises the steps of: (k) selectively forming a fifth semiconductor layer in the top surface of the second semiconductor layer and between apex portions of adjacent first trenches; (l) forming a second trench by etching a structure heretofore obtained, the second trench extending from an top surface of the fifth semiconductor layer into the first semiconductor layer through the second semiconductor layer; (m) forming a second insulation layer in the second trench; (n) depositing a second conductive layer on the second insulation layer; and (o) selectively removing the second conductive layer except for a portion within the second trench at an apex portion, thereby a second control electrode being obtained.

According to the present invention, the semiconductor device includes the channel near the trench in the first semiconductor layer during ON-state device operation.

On the other hand, electric field concentration is avoided during OFF-state device operation. This is because of the configuration of the trench. When taken perpendicularly to a direction along which a distance from the top major surface to the bottom major surface is measured, the cross sectional area of the trench increases from the top major surface to the bottom major surface. Hence, the cross sectional area of the first semiconductor layer decreases with a distance from the top major surface to the bottom major surface. As a result, electric field concentration is avoided.

Besides, the method of manufacturing the semiconductor device of the present invention requires that the first trench is etched from the bottom major surface side. Hence, the first control electrode formed in the first trench is situated opposite the first electrode through the first semiconductor layer.

Thus, in the semiconductor device of the present invention, insulation between the control electrode and the first electrode is not degraded even when process patterns are refined because the control electrode and the first electrode are disposed on the opposite major surface each other of the first semiconductor layer. In addition, current flow during ON-state device operation is allowed only near the trench. Hence, JFET resistance associated to a depletion layer extending in the first semiconductor layer would not affect performance of the semiconductor device. Thus, the semiconductor device of the present invention has high breakdown voltage and low on-resistance.

Moreover, breakdown voltage during OFF-state device operation is enhanced since the cross sectional area of the first semiconductor layer decreases with a distance from the top major surface to the bottom major surface.

Still other important feature of the present invention is that the trench is formed from the bottom major surface side and the control electrode is disposed in the trench. The control electrode and the first electrode are disposed opposite each other through the first semiconductor layer thereby.

Accordingly, an object of the present invention is to obtain a semiconductor device having high breakdown voltage and low on-resistance in which insulation between electrodes is excellent even when patterns have refined features and the JFET resistance does not degrade device operation.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
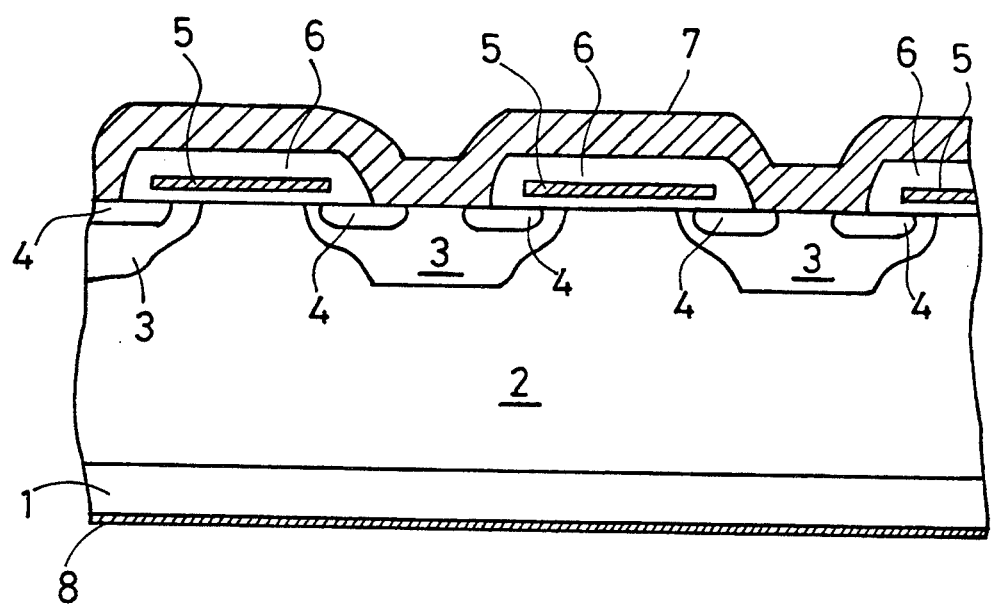
FIG. 1 is a cross sectional view of a conventional VDMOS device.
Figure 2:
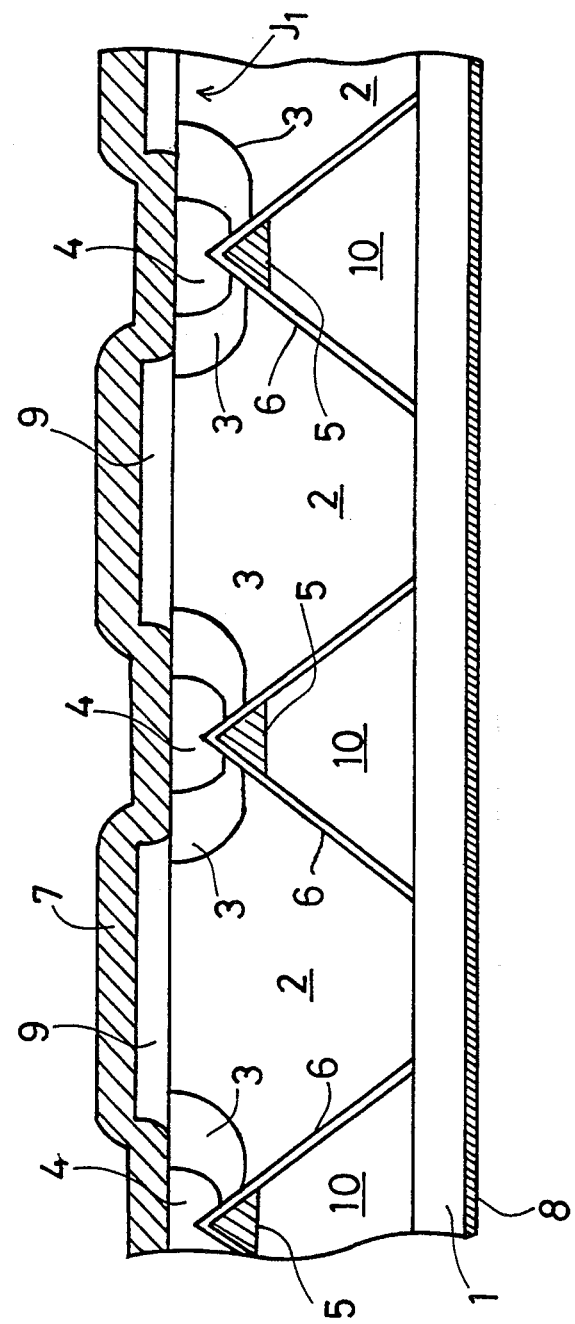
FIG. 2 is a cross sectional view illustrating a first preferred embodiment of the present invention.

FIG. 2 is a cross sectional view of a VDMOS device according to a first preferred embodiment of the present invention.

The VDMOS device of FIG. 2 comprises an N+ type semiconductor substrate 1. An N− type semiconductor layer 2 is disposed on a top major surface of the N+ type semiconductor substrate 1. The semiconductor layer 2 includes in a top major surface thereof P type well regions 3 each including an N+ type source region 4. The N+ type source region 4 is selectively formed in the top surface of each P type well region 3.

The semiconductor layer 2 further includes at least one trench 10. The trench 10 opens wide at a bottom major surface of the semiconductor layer 2, i.e., an interface between the semiconductor layer 2 and the semiconductor substrate 1, and tapers toward the top major surface of the semiconductor layer 2. In other words, the trench 10 is a triangular pole with a generating line being perpendicular to the drawing paper of FIG. 2. The tapering edge, or the apex of the trench 10 penetrates the well region 3 and infringes upon the source region 4.

The inner wall of the trench 10 is covered with a gate oxide film 6 through which a gate electrode 5 is disposed opposite the well region 3. Thus, the VDMOS device includes MOS structure formed by the gate electrode 5, the gate oxide film 6 and the well region 3.

The semiconductor layer 2 is covered with the oxide film 9 at the well region 3 and the source regions 4 so that it is insulated from a source electrode 7.

The VDMOS device further includes a drain electrode 8 on the bottom major surface of the semiconductor substrate 1.

During ON-state device operation, the drain electrode 8 and the gate electrode 5 are kept at higher potential than the source electrode 7, so as to invert the conductivity type of the well region 3 near the trench 10, thereby forming an electron-flow channel through which electron flow is allowed from the source region 4 to the semiconductor layer 2. The ON-state device operation of the VDMOS device of FIG. 2 is similar to that of the conventional VDMOS transistor in that the conductivity type inversion allows electrons to flow from the source region to the semiconductor layer. However, a clear advantage of the VDMOS device of FIG. 2 is that the electron flow is allowed along the trench 10, and therefore, practically free from influence of JFET resistance which is created by a growing depletion layer extending from PN junction between the well region 3 and the semiconductor layer 2.

The VDMOS device of FIG. 2 has another advantage. Well separated by the semiconductor layer 2, the well region 3 and the source region 4, the gate electrode 5 and the source electrode 7 remain insulated sufficiently from each other even if process patterns are refined with an intention to reduce on-resistance.

During OFF-state device operation, the gate electrode 5 and the source electrode 7 are short-circuited (kept at the same potential) while the drain electrode 8 is kept at higher potential than the gate electrode 5 and the source electrode 7. Thus, the source electrode 7 and the drain electrode 8 apply reverse bias on a PN junction J1 between the well region 3 and the semiconductor layer 2. As a result, a depletion layer is created which extends from the PN junction J1.

The growing depletion layer reaches the semiconductor substrate 1, thereby breakdown voltage being maintained, which is similar to the conventional VDMOS device. To enhance the breakdown voltage, it is desirable that the trench 10 tapers toward the source electrode 7 as shown in FIG. 2. When the trench 10 has such a configuration, electric field at the PN junction is prevented from exceeding electric field at the semiconductor layer 2, which helps a depletion layer develop. Thus, high breakdown voltage is attained.

As described above, the gate electrode 5 is contained in the semiconductor layer 2. To ensure a path through which voltage is applied to the gate electrode 5, the VDMOS device of FIG. 2 further includes at least one trench 11. The trench 11 is deeper than the trench 10 so that the gate electrode 5 projects at the top major surface of the semiconductor layer 2.

Figure 3:
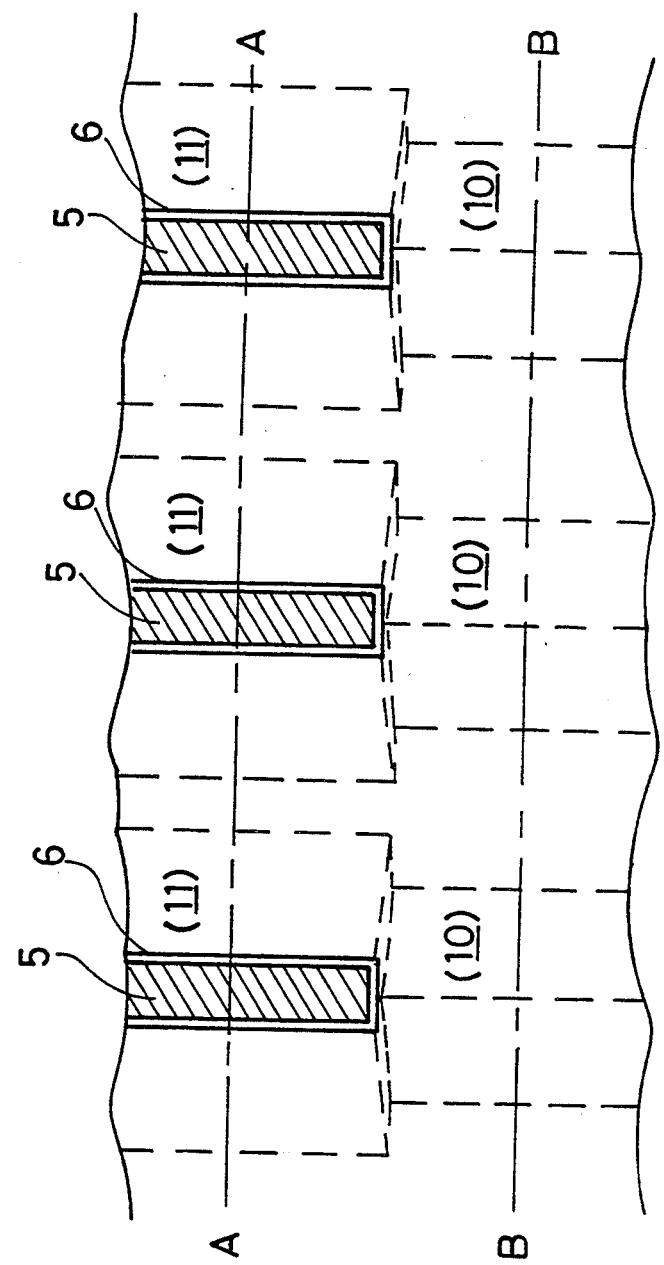
FIG. 3 is a plan view to explain how a voltage path which connects the upper side and a gate electrode of the VDMOS device of FIG. 2 is ensured.
Figure 4:
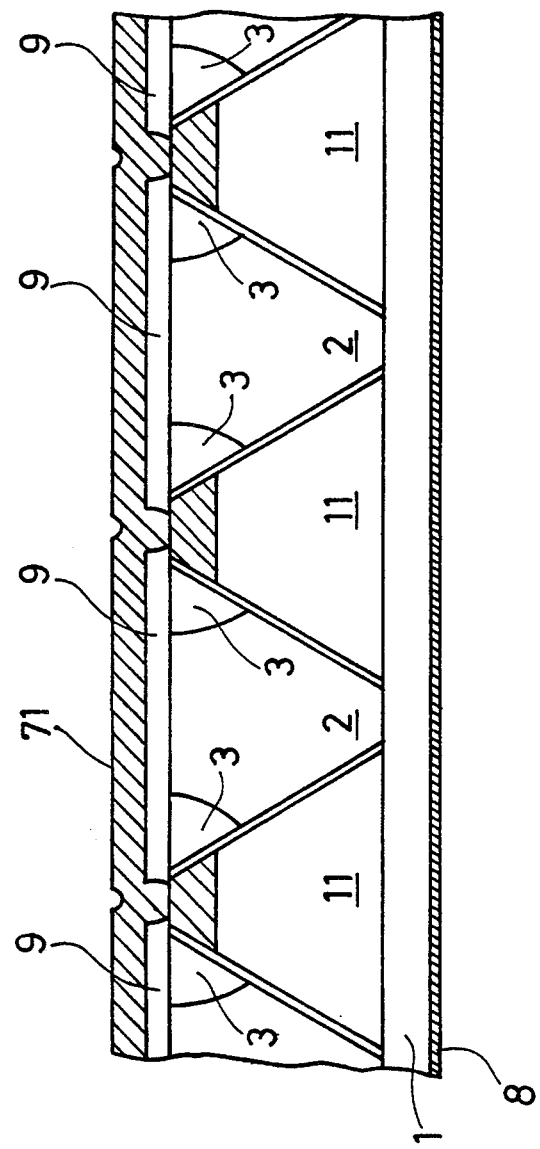
FIG. 4 is a cross sectional view of the VDMOS device of FIG. 3 taken along a line A—A.
Figure 5:
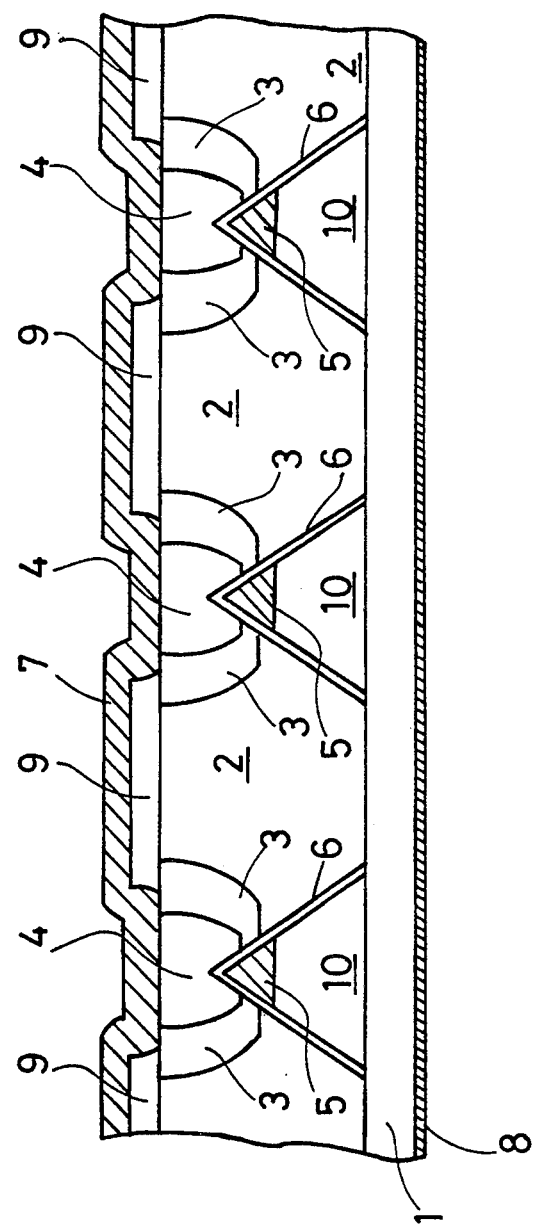
FIG. 5 is a cross sectional view of the VDMOS device of FIG. 3 taken along a line B—B.

FIGS. 3–5 are diagrams showing how the trenches 10 and 11 are disposed in the VDMOS device. To be more precise, FIG. 3 is a plan view of the VDMOS device of FIG. 2. FIGS. 4 and 5 are cross sectional views of the VDMOS device taken along the line A—A and the line B—B of FIG. 3, respectively. The portion shown in FIG. 5, which is similar in structure to the portion shown in FIG. 2, serves as VDMOS transistor. On the other hand, the portion shown in FIG. 4 includes the trench 11 which is deeper than the trench 10 so that the gate electrode 5 directly contacts an electrode 71 (pull-out electrode). The electrode 71 is insulated from the semiconductor layer 2 and the well region 3 by the oxide film 9. The oxide film 9, the source electrode 7 and the electrode 71 are omitted in FIG. 3 for clarity. Needless to mention, however, the source electrode 7 and the electrode 71 are insulated from each other.

Next, a method of manufacturing the VDMOS device of the first preferred embodiment will be described (second preferred embodiment), while referring to FIGS. 8–13.

First, the semiconductor layer 2 is selectively etched in the bottom major surface by anisotropic etching to form the trench 10. The semiconductor layer 2 is made of N− type silicon, for example. The trench 11 as shown in FIGS. 3 and 4 is formed in a similar manner by the anisotropic etching, although not illustrated. The depths of the trenches 10 and 11 are determined by the plane areas etched at the bottom major surface of the semiconductor layer 2. That is, the larger the area etched at the bottom major surface is, the deeper the resulting trenches becomes.

Figure 8:
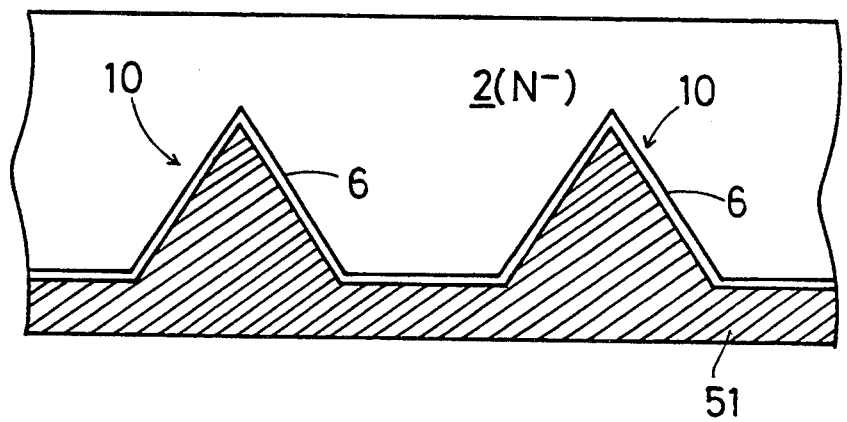
FIGS. 8 to 13 are cross sectional views of process steps of manufacturing the VDMOS device of FIG. 2.

Following the anisotropic etching, the gate oxide film 6 is grown to cover the entire bottom major surface of the semiconductor layer 2. Then, polycrystalline silicon 51 is deposited on the oxide film 6 (FIG. 8).

Figure 9:
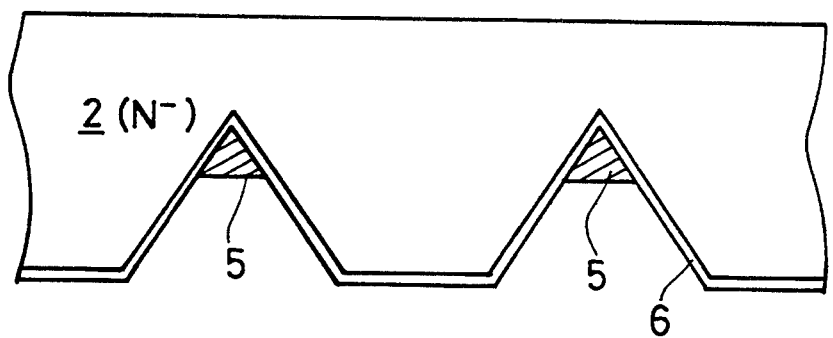

The polycrystalline silicon 51 is thereafter etched except at around the apex of the trench 10 so that the gate electrode 5 is formed at that unetched region (FIG. 9).

Figure 10:
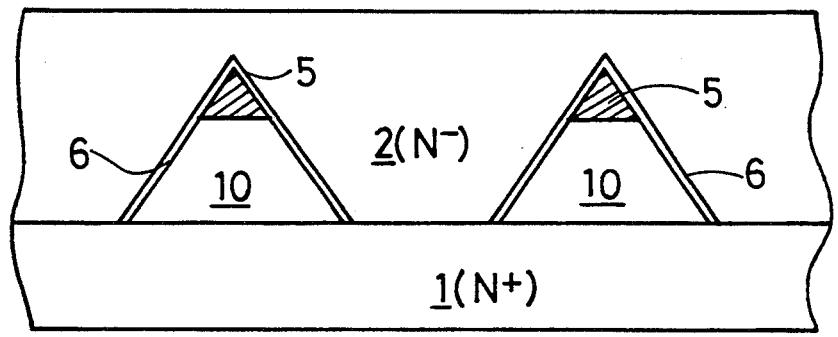

Next, the gate oxide film 6 is lapped except at the portion covering the trench 10 so that the semiconductor layer 2 has an uncovered surface at the bottom major surface. The semiconductor layer 2 is thereafter combined at the bottom major surface with the N+ type semiconductor substrate 1 which was prepared separately in advance. The semiconductor substrate 1 is made of material such as N+ type silicon. To adjust the thickness, the semiconductor layer 2 is lapped at the top major surface, whereby the apex of the trench 10 is away from the top major surface of the semiconductor layer by an appropriate spacing (FIG. 10). A general approach in lapping the semiconductor layer 2 to a predetermined appropriate thickness is to use an etching trench (not shown) as an indicator which indicates the thickness left unpolished. The etching trench is deeper than the trench 10, and therefore, the semiconductor layer 2 is lapped to the predetermined thickness by lapping the semiconductor layer 2 until it is penetrated by the apex of the etching trench.

Figure 11:
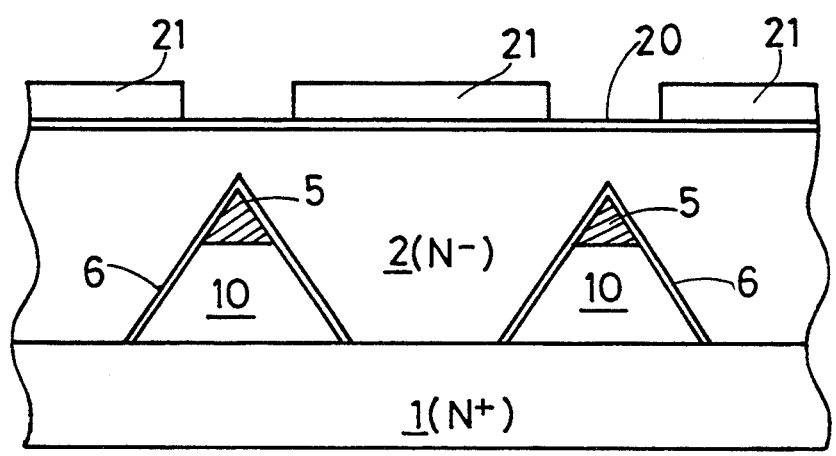

After this treatment, the top major surface of the semiconductor layer 2 is covered entirely with an oxide film 20 for ion implantation. With a resist 21 selectively disposed on the oxide film 20 as a mask, boron ions are implanted into the semiconductor layer 2 at around the trench 10 (FIG. 11). In the remaining process steps, the etching trench now projecting at the top major surface of the semiconductor layer 2 is used as an alignment mark for mask alignment.

Figure 12:
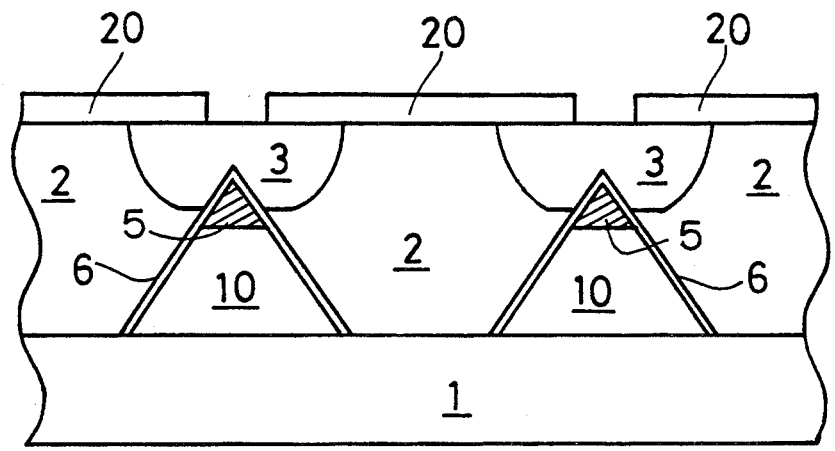

Diffusion of boron forms the well region 3 which includes the apex of the trench 10. The diffusion also causes thermal oxidation of the oxide film 20 thereby the oxide film 20 thickens. The oxide film 20 gained in thickness is selectively removed in such a manner that the well region 3 has an uncovered surface above the trench 10 (FIG. 12). The source region 4 is thereafter formed by implantation and diffusion of phosphorus.

Figure 13:
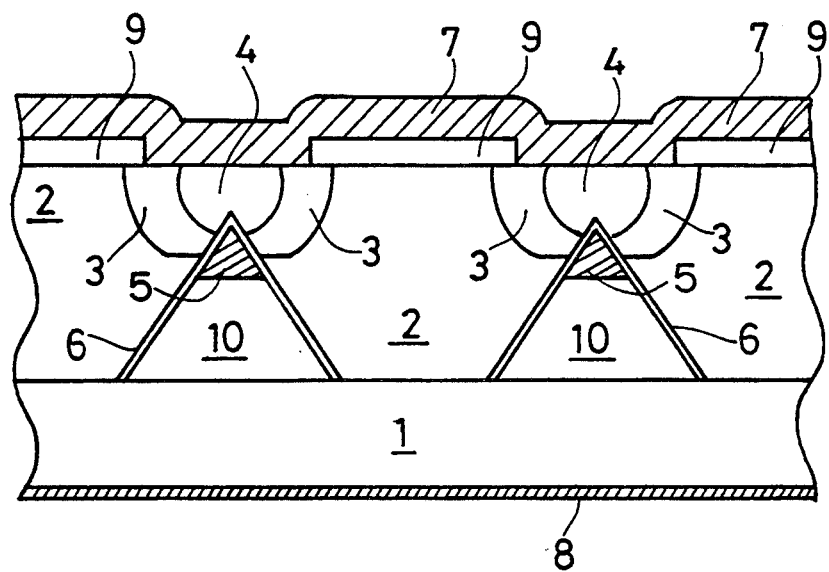

The oxide film 20 is then removed and the oxide film 9 is selectively formed on the top major surface of the semiconductor layer 2 so that the oxide film 9 covers the uncovered surface of the semiconductor layer 2 and a portion of the well region 3. Following this, the top major surface of the structure obtained so far is covered with the source electrode 7, thereby ensuring contact between the source electrode 7 and the source region 4 and contact between the source electrode 7 and the well region 3. The drain electrode 8 is disposed on the bottom major surface of the semiconductor substrate 1 (FIG. 13). Finally, the VDMOS device of FIG. 2 is completed.

Thus, the gate electrode 5 and the source electrode 7 are separated by the semiconductor layer 2, the well region 3 and the source region 4 since the trench 10 is etched from the bottom major surface of the semiconductor layer 2.

Figure 6:
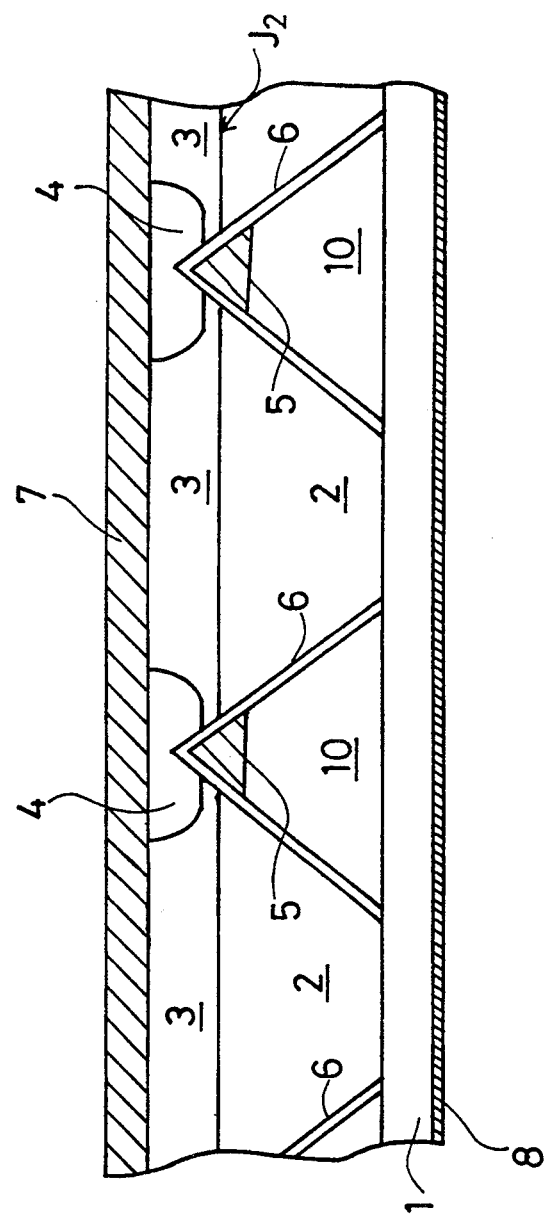
FIG. 6 is a cross sectional view illustrating a third preferred embodiment of the present invention.

Now, a VDMOS device according to a third preferred embodiment of the present invention will be described. FIG. 6 is a cross sectional view of the VDMOS device according to the third preferred embodiment of the present invention.

Likewise the VDMOS device of the first preferred embodiment, the VDMOS device of the third preferred embodiment includes an N+ type semiconductor substrate 1 and an N− type semiconductor layer 2 formed thereon. A P type well region 3 overlies the semiconductor layer 2. The well region 3 of the third preferred embodiment is much wider than the corresponding region in the first preferred embodiment, and includes N+ type source regions 4 selectively formed in the top surface thereof. The semiconductor layer 2 includes at least one trench 10, which is also similar to the first preferred embodiment. The trench 10 opens at the bottom major surface of the semiconductor layer 2, i.e., an interface between the semiconductor layer 2 and the semiconductor substrate 1, and tapers toward the well region 3. The apex of the trench 10 (farthest portion from the semiconductor substrate 1) penetrates the well region 3 and infringes upon the source region 4.

The inner wall of the trench 10 is covered with a gate oxide film 6. Similarly to the first preferred embodiment, the VDMOS device includes MOS structure formed by the gate electrode 5, the gate oxide film 6 and the well region 3.

A difference from the VDMOS device of the first preferred embodiment is that the semiconductor layer 2 is entirely covered with the well region 3, and a source electrode ? is disposed directly on the well region 3 and the source region 4. A drain electrode 8 on the bottom surface of the semiconductor substrate 1.

As is required in conventional VDMOS devices, the drain electrode 8 and the gate electrode 5 are kept at higher potential than the source electrode 7 during ON-state device operation.

With the drain and the gate electrodes 8 and 5 at higher potential than the source electrode 7, the conductivity type of the well region 3 is inverted into N type in the vicinity of the trench 10. Thus, an electron-flow channel is created through which electrons flow from the source region 4 into the semiconductor layer 2. This is similar to the first preferred embodiment.

While the channel is created, a depletion layer grows from a PN junction J2 between the well region 3 and the semiconductor layer 2. However, since the PN junction J2 is perpendicular to the direction along which the thickness of the semiconductor layer 2 is measured, growth of the depletion layer is one-dimensional growth along the thickness of the semiconductor layer 2. Hence, the growing depletion layer does not obstruct current flow. In other words, the JFET resistance would not occur.

In addition, the gate electrode 5 and the source electrode 7 are separated by the semiconductor layer 2, the well region 3 and the source region 4, similarly to the first preferred embodiment. Hence, insulation between the gate electrode 5 and the source electrode 7 remain unaffected even when the process patterns are refined.

During OFF-state device operation, the gate electrode 5 and the source electrode 7 are short-circuited while the drain electrode 8 is kept at higher potential than the gate electrode 5 and the source electrode 7. Since the PN junction J2 is perpendicular to the thickness of the semiconductor layer 2, a depletion layer associated with reverse bias grows along the thickness of the semiconductor layer 2; that is, growth of the depletion layer is one-dimensional growth toward the semiconductor substrate 1. In such device operation, breakdown voltage is maintained due to the depletion layer reaching the semiconductor substrate 1. Therefore, an advantage of the VDMOS device of the third preferred embodiment is that high breakdown voltage is ensured since the depletion layer would easily grow due to the structure that the semiconductor layer 2 reduces in width toward the semiconductor substrate 1. This effect is similar to what is ensured in the VDMOS device of the first preferred embodiment, To ensure a path through which voltage is applied to the gate electrode 5, the VDMOS device of the third preferred embodiment includes the structure as shown in FIG. 3.

Next, a method of manufacturing the VDMOS device of the third preferred embodiment will be described (fourth preferred embodiment). The corresponding drawings are FIGS. 14–16.

First, a structure as shown in FIG. 10 is manufactured. The process steps to obtain such structure are similar to the corresponding steps of the second preferred embodiment.

Figure 14:
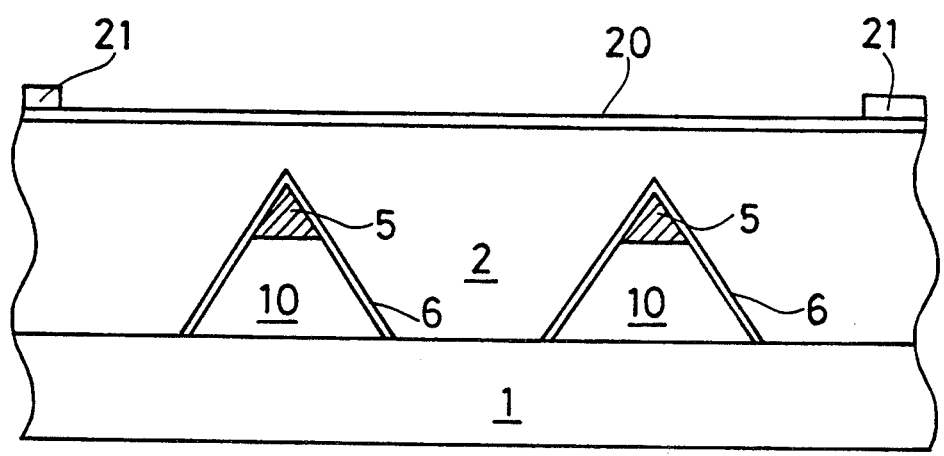
FIGS. 14 to 16 are cross sectional views of process steps of manufacturing the VDMOS device of FIG. 6.
Figure 15:
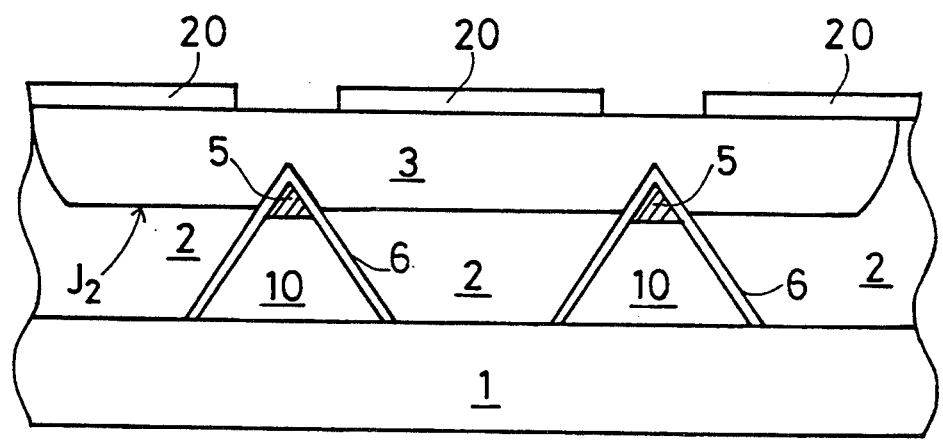

An oxide film 20 is then grown on the entire top major surface of the semiconductor layer 2. The oxide film 20 is used as an implantation mask in ion implantation. A resist film 21 is then selectively formed on the oxide film 20. Unlike the first preferred embodiment, the resist film 21 includes an aperture beneath which a plurality of trenches 10 are situated (FIG. 14). Thereafter, boron ions are implanted into the semiconductor layer 2 through the aperture of the resist film 21 and diffused. The resulting well region 3 spreads across the trenches 10 beneath the aperture and includes the apexes of the trenches 10. Thus, in the vicinity of the trenches 10, where the VDMOS device functions as a VDMOS transistor, the well region 3 comprises at its interface with the semiconductor layer 2 a PN junction J2 which extends perpendicular to the thickness of the semiconductor layer 2. The boron ion implantation thickens the oxide film 20. The thickened oxide film 20 is therefore selectively removed so that the well region 3 has uncoated surfaces above the trenches 10 (FIG. 15).

Figure 16:
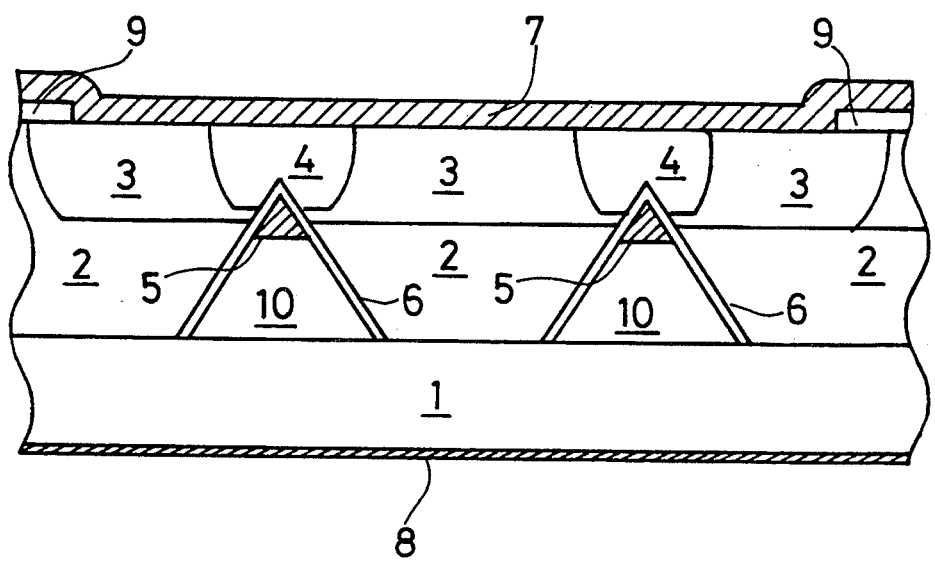

Using the selectively remaining oxide film 20 as a mask, phosphorous ions are then implanted into the well region 3 and diffused so as to form the source regions 4. The oxide film 20 is thereafter removed and the oxide film 9 is selectively formed on the well region 3 and the source regions 4. The oxide film 9 includes an aperture on the well region 3 (FIG. 16). The source electrode 7 is then formed on the entire top major surface of the structure heretofore obtained. Thus, the source electrode 7 contacts both the source regions 4 and the well region 3. By further adding the drain electrode 8 on the entire bottom major surface of the semiconductor substrate 1, the VDMOS device of the third preferred embodiment is completed (FIG. 16).

The VDMOS device thus fabricated ensures enough separation between the gate electrode 5 and the source electrode 7 because the semiconductor layer 2, the well region 3 and the source region 4 are disposed therebetween, which structure is shared by the first preferred embodiment.

Figure 7:
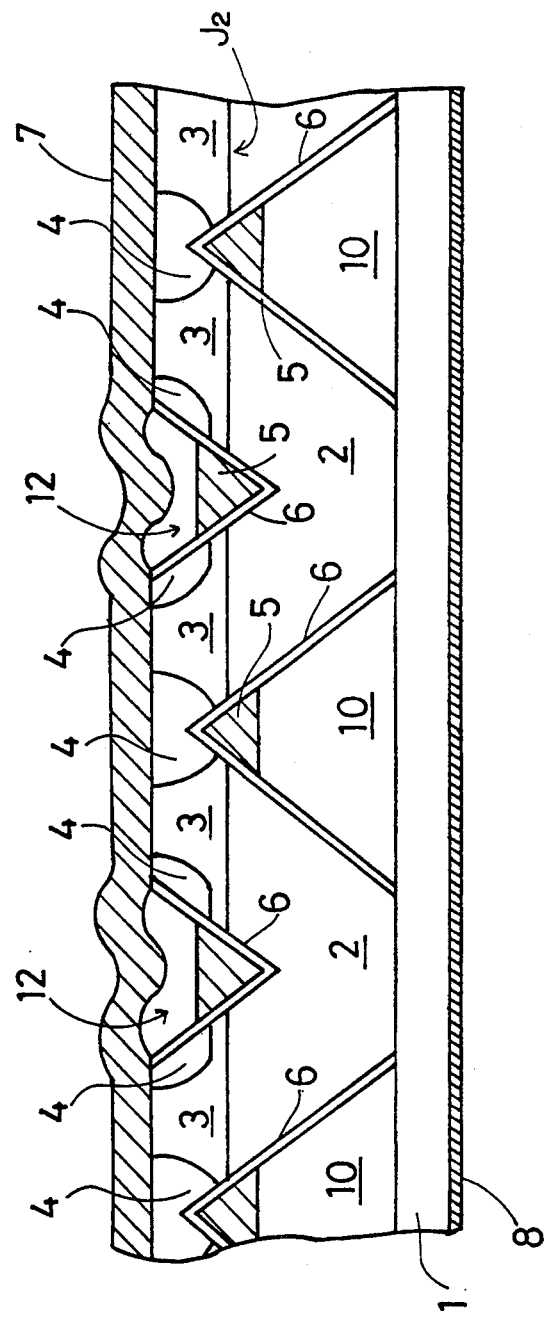
FIG. 7 is a cross sectional view illustrating a fifth preferred embodiment of the present invention.

Now, a VDMOS device according to a fifth preferred embodiment of the present invention will be described. FIG. 7 is a cross sectional view of the VDMOS device according to the fifth preferred embodiment of the present invention. Likewise the VDMOS device of FIG. 6 (third preferred embodiment), a semiconductor layer 2 is formed on a semiconductor substrate 1 and the semiconductor layer 2 is covered with a well region 3 on the top major surface thereof. The well region 3 of the fifth preferred embodiment is much wider than the corresponding region of the first preferred embodiment, and includes in the top major surface selectively formed source regions 4. The VDMOS device also includes at least one trench 10. The trenches 10 extend from the bottom major surface of the semiconductor layer 2 into the source regions 4. A sharp difference between the fifth preferred embodiment and the first and the third preferred embodiments is that some source regions 4 are not infringed upon by the apexes of the trenches 10. Instead, such source regions 4 are each penetrated upon by a trench 12 as well as the well region 3. The trenches 12 extend from the top major surface of the source regions 4 into the semiconductor layer 2.

The trenches 10 and 12 are each covered on the inner wall with a gate oxide film 6 through which a gate electrode 5 is situated opposite the well region 3. Thus, similarly to the first and the third preferred embodiments, the VDMOS device of the fifth preferred embodiment includes MOS structure formed by the gate electrode 5, the gate oxide film 6 and the well region 3.

The semiconductor layer 2 is entirely covered with the well region 3, a source electrode 7 is provided on the well region 3 and the source regions 4, and a drain electrode 8 on the bottom major surface of the semiconductor substrate 1, similarly to the third preferred embodiment.

During ON-state device operation, the drain electrode 8 and the gate electrode 5 are kept at higher potential than the source electrode 7.

When the drain and the gate electrodes 8 and 5 are at higher potential than the source electrode 7, the conductivity type of the well region 3 is partially inverted into N type in the vicinity of the trenches 10 and 12. Thus, an electron-flow channel is created through which electrons flow from the source regions 4 into the semiconductor layer 2. A depletion layer grows from the PN junction J2 in a practically one-dimensional manner along the thickness of the semiconductor layer 2. Hence, the JFET resistance would not result.

The fifth preferred embodiment is advantageous over the third preferred embodiment in that the device of the fifth preferred embodiment includes more electron-flow channels created during the ON-state operation than in the third preferred embodiment. More channels, of course, mean lower on-resistance.

The OFF-state device operation of the VDMOS device of the fifth preferred embodiment is similar to that of the third preferred embodiment. In the fifth preferred embodiment, a depletion layer growth is one-dimensional, and electric field at the PN junction J2 is not extraordinary. Hence, the VDMOS device of the fifth preferred embodiment has high breakdown voltage.

In addition, likewise in the first preferred embodiment, the VDMOS device of the fifth preferred embodiment includes a path through which voltage is applied to the gate electrode 5 disposed in the trench 10. On the other hand, a conventional means is employed in the VDMOS device to ensure a voltage path which connects the upper side of the device and the gate electrodes 5 disposed in the trenches 12.

Next, a method of manufacturing the VDMOS device of the fifth preferred embodiment will be described (sixth preferred embodiment). The corresponding drawings are FIGS. 17–20, cross sectional views showing process steps of manufacturing the VDMOS device of the fifth preferred embodiment.

First, a structure as shown in FIG. 14 is formed. The process steps to obtain such structure are similar to the corresponding steps of the fourth preferred embodiment.

Figure 17:
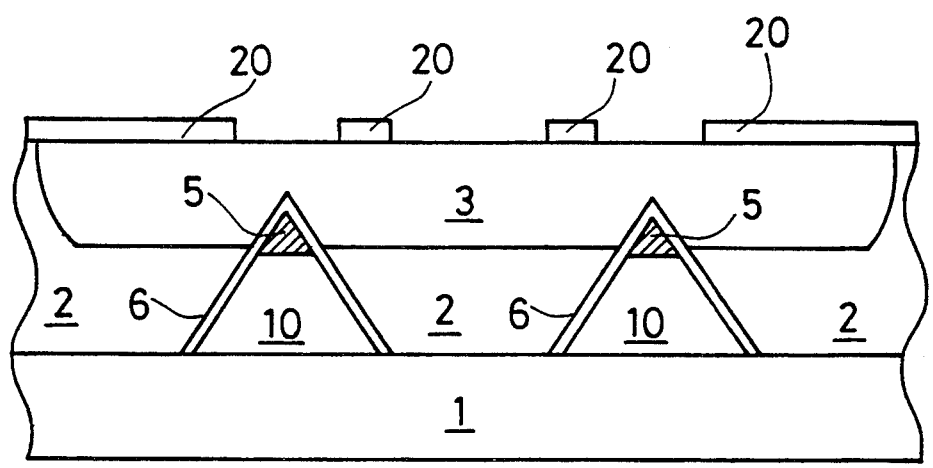
FIGS. 17 to 20 are cross sectional views of process steps of manufacturing the VDMOS device of FIG. 7.

An oxide film 20, gained in thickness due to diffusion by which the well region 3 is formed, is selectively removed. Unlike the fourth preferred embodiment, the oxide film 20 is removed not only above the apexes of the trenches 10 but also above a region between neighboring trenches 10 (FIG. 17).

Figure 18:
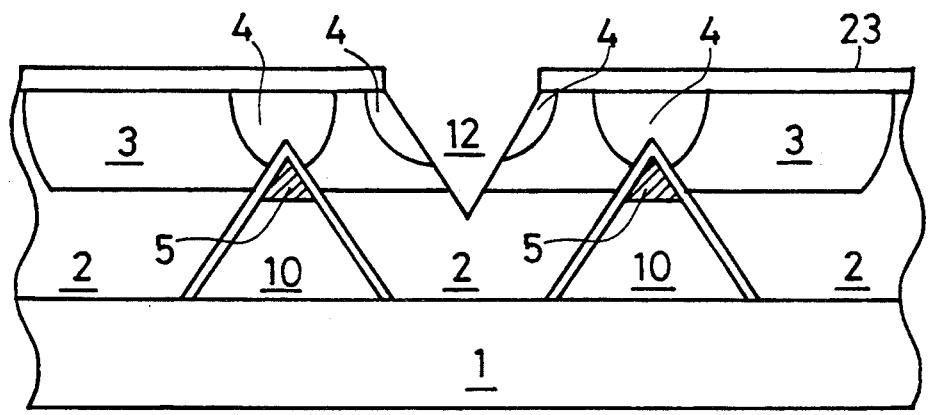

Using the selectively remaining oxide film 20 as a mask, phosphorous ions are then implanted into the well regions 3 and diffused so as to form the source regions 4. The oxide film 20 is thereafter removed and a nitride film 23 is selectively formed except at the source regions 4 which are situated between neighboring trenches 10. Anisotropic etching is then performed using the nitride film 23 as a mask to form the trenches 12 so that the resulting trenches 12 penetrate the source regions 4 and the well region 3 and infringe on the semiconductor layer 2 (FIG. 18).

Figure 19:
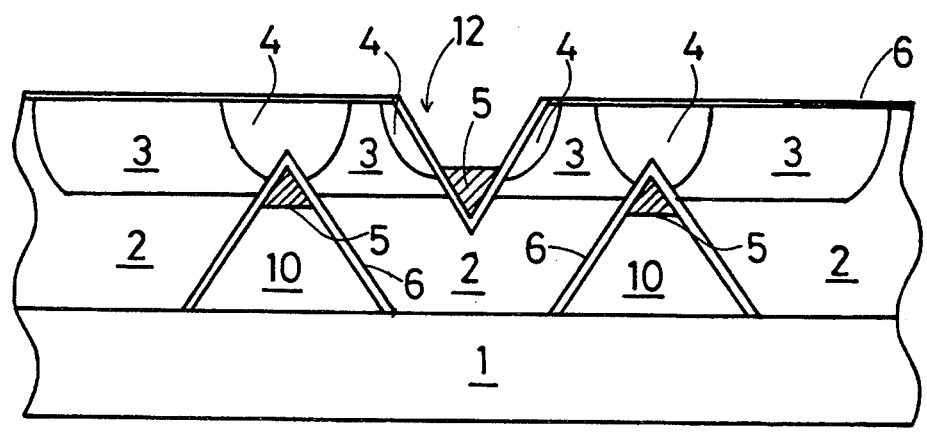

Following this, the nitride film 23 is removed entirely and the structure obtained so far is covered on the top surface with the gate oxide film 6, the process step of forming the gate oxide 6 being similar to the step described in relation to FIG. 8. Polycrystalline silicon is then deposited on the gate oxide film 6, followed by etching in which the polycrystalline silicon is removed except at the apexes of the trenches 12 (in the nearest portion to the semiconductor substrate 1). Thus, the gate electrodes 5 disposed in the trenches 12 are formed (FIG. 19).

The structure heretofore obtained is then coated with an oxide film 9. In other words, the oxide film 9 is formed on the gate oxide film 6. Thereafter, the oxide film 9 is patterned as well as the gate oxide film 6 so that the surfaces of the well region 3 and the source regions 4 are uncovered. As a result, the gate electrodes 5 in the trenches 12 (in the upper portion of the semiconductor layer 2) is covered with the oxide film 9.

Figure 20:
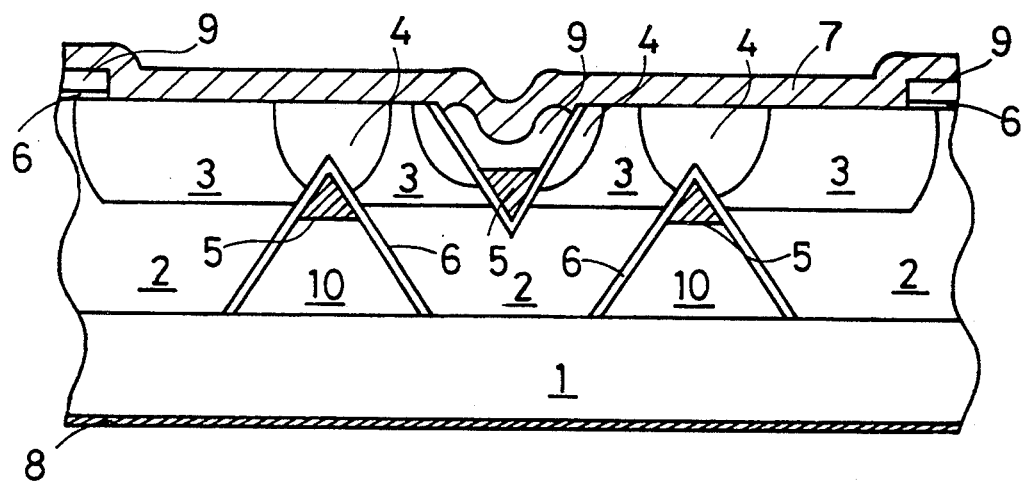

The source electrode 7 is then formed on the entire top major surface of the structure heretofore obtained. By further adding the drain electrode 8 on the entire bottom major surface of the semiconductor substrate 1, the VDMOS device of the fifth preferred embodiment is completed (FIG. 20).

While the invention has been shown and described in detail, the foregoing description is in all aspects illustrative and not restrictive. It is understood that numerous modifications and variations can be devised without departing from the scope of the invention.

I claim:

1. A method of manufacturing a semiconductor device, comprising the steps of:
   (a) etching a first conductivity type first semiconductor layer having a top major surface and a bottom major surface, said etching being initiated from said bottom major surface, thereby at least one first trench being formed;
   (b) forming a first insulation layer entirely on the bottom surface of the structure obtained in said step (a);
   (c) depositing a first conductive layer on said first insulation layer;
   (d) selectively removing said first conductive layer except for a portion within said at least one first trench at the apex portion, thereby a first control electrode being obtained;
   (e) lapping said first semiconductor layer from said top major surface to leave a thickness of said first semiconductor layer;
   (f) removing said first insulation layer except at a portion covering said first trench;
   (g) selectively forming a second conductivity type channel region on said major top surface so that the at least one apex portion of said at least one first trench is contained by said channel region;
   (h) selectively forming a first conductivity type first source/drain region in said top surface of said channel region so that the at least one apex portion of said at least one first trench is contained by said first source/drain region;
   (i) forming a first electrode, said first electrode being insulated from said first semiconductor layer at said top major surface, said first electrode being in contact with said channel region and said first source/drain region; and
   (j) forming a second electrode over the bottom major surface side.

2. A method of claim 1, wherein said step (i) further comprises the steps of:
   (i-1) forming a patterned second insulation layer at least on said top major surface of said first semiconductor layer: and
   (i-2) forming a first electrode entirely across a top surface of the structure obtained in said steps (a) to (i-2).

3. A method of claim 1, wherein said step (j) further comprises the steps of:
   (j-1) forming a first conductivity type second semiconductor layer on said bottom major surface of said first semiconductor layer; and
   (j-2) forming the second electrode on said second semiconductor layer.

4. A method of claim 1, wherein said at least one first trench includes a plurality of first trenches and said at least one apex portion includes a plurality of apex portions.

5. A method of claim 4, further comprising the steps of:
   (k) selectively forming a second source/drain region in said top surface of said channel region and between apex portions of adjacent first trenches;
   (l) forming a second trench by etching the resultant structure, said second trench extending from the top surface of said second source/drain region into said first semiconductor layer through said channel region;
   (m) forming a second insulation layer in said second trench;
   (n) depositing a second conductive layer on second insulation layer; and
   (o) selectively removing said second conductive layer except for a portion within said second trench at the plurality apex portions, thereby a second control electrode being obtained.

* * * * *

UNITED STATES PATENT AND TRADEMARK OFFICE
CERTIFICATE OF CORRECTION

PATENT NO. : 5,344,789
DATED : September 6, 1994
INVENTOR(S) : Tomohide TERASHIMA It is certified that error appears in the above-indentified patent and that said Letters Patent is hereby corrected as shown below:

On the title page, Item [30], the Foreign Application Priority Date should read:

--Jun. 17, 1991--

Signed and Sealed this

Fifteenth Day of November, 1994

Attest:

BRUCE LEHMAN

Attesting Officer

Commissioner of Patents and Trademarks